United States Patent
Ozawa et al.

(10) Patent No.: US 6,262,543 B1
(45) Date of Patent: Jul. 17, 2001

(54) OSCILLOSCOPE INTENSITY REGULATION APPARATUS

(75) Inventors: Satoshi Ozawa; Kikutada Yoshida, both of Tokyo (JP)

(73) Assignee: Iwatsu Electric Co., Ltd., Tokyo (JP)

( * ) Notice: Subject to any disclaimer, the term of this patent is extended or adjusted under 35 U.S.C. 154(b) by 0 days.

(21) Appl. No.: 09/249,849

(22) Filed: Feb. 16, 1999

(30) Foreign Application Priority Data

Mar. 23, 1998 (JP) .................................................. 10-094126

(51) Int. Cl.$^7$ .............................. G09G 1/04; G09G 1/06; G09G 5/10; H01J 23/34
(52) U.S. Cl. ............................. 315/383; 345/12; 345/147; 315/1
(58) Field of Search ............................. 315/383; 345/12, 345/102, 147

(56) References Cited

U.S. PATENT DOCUMENTS

| | | | | |
|---|---|---|---|---|
| 3,829,613 | * | 8/1974 | Melchior | 348/701 |
| 3,830,970 | * | 8/1974 | Hurley et al. | 348/164 |
| 3,882,359 | * | 5/1975 | Secher | 315/383 |
| 3,995,197 | * | 11/1976 | Caswell | 315/383 |
| 4,215,294 | * | 7/1980 | Taggart | 315/383 |
| 4,618,254 | * | 10/1986 | Therrien et al. | 355/68 |
| 4,633,145 | * | 12/1986 | Osawa et al. | 315/383 |
| 5,025,196 | * | 6/1991 | Suzuki et al. | 315/168 |
| 5,315,695 | * | 5/1994 | Saito et al. | 345/432 |
| 5,705,891 | * | 1/1998 | Ishida et al. | 315/1 |

FOREIGN PATENT DOCUMENTS

1360534 * 7/1974 (GB) .............................. G06K/15/20

* cited by examiner

Primary Examiner—Jeffery Brier
Assistant Examiner—Ryan Yang
(74) Attorney, Agent, or Firm—Oblon, Spivak, McClelland, Maier & Neustadt, P.C.

(57) ABSTRACT

An oscilloscope intensity regulation apparatus is disclosed. The oscilloscope displays wave-forms with the regulated intensity in spite of various wave-form repetition rates or sweep ranges. The scope has a CCD sensor 11 on a CRT 10. The CCD output 28 is applied to a video circuit 12 delivering a video signal 29. The CPU 4 instructs an intensity of an electron beam to a Z-axis circuit 8 and an AGC (automatic gain control) revision signal 27 to a AGC circuit 13 in accordance with an intensity input signal 21. The AGC circuit 13 controls its gain for amplifying a video signal 29 from the CCD 11 via the video circuit 12. When the video signal 29 is small in its amplitude, the AGC circuit 13 has a large gain. When the video signal 29 is large, the circuit 13 has a small gain. Therefore, an intensity of wave-forms being displayed is regulated in the intensity desired, in spite of various repetition rates of the wave-forms or sweep velocities.

7 Claims, 15 Drawing Sheets

Rep. Rate M. 6

FIG. 15

OSCILLOSCOPE INTENSITY REGULATION APPARATUS

BACKGROUND OF THE INVENTION

1. Field of the Invention

The present invention relates to an oscilloscope intensity regulation apparatus.

The invention is particularly concerned with an apparatus of an oscilloscope for displaying wave-forms with a regulated intensity in spite of variations of repetition rates of the wave-forms and sweep velocities in the oscilloscope.

2. Description of the Prior Art

In an oscilloscope with a cathode-ray tube (CRT) for displaying wave-forms, low repetition rate wave-forms swept at high speed are displayed with insufficient intensity. It is, therefore, difficult to observe the wave-forms displayed with insufficient intensity on the CRT.

There is an oscilloscope with a charge coupled device (CCD) sensor on a surface of the CRT. The CCD sensor obtains a video signal for displaying the wave-forms. Wave-forms with enough strong intensity are observable by means of video signal via the CCD sensor without direct viewing on the CRT.

Figure 1:
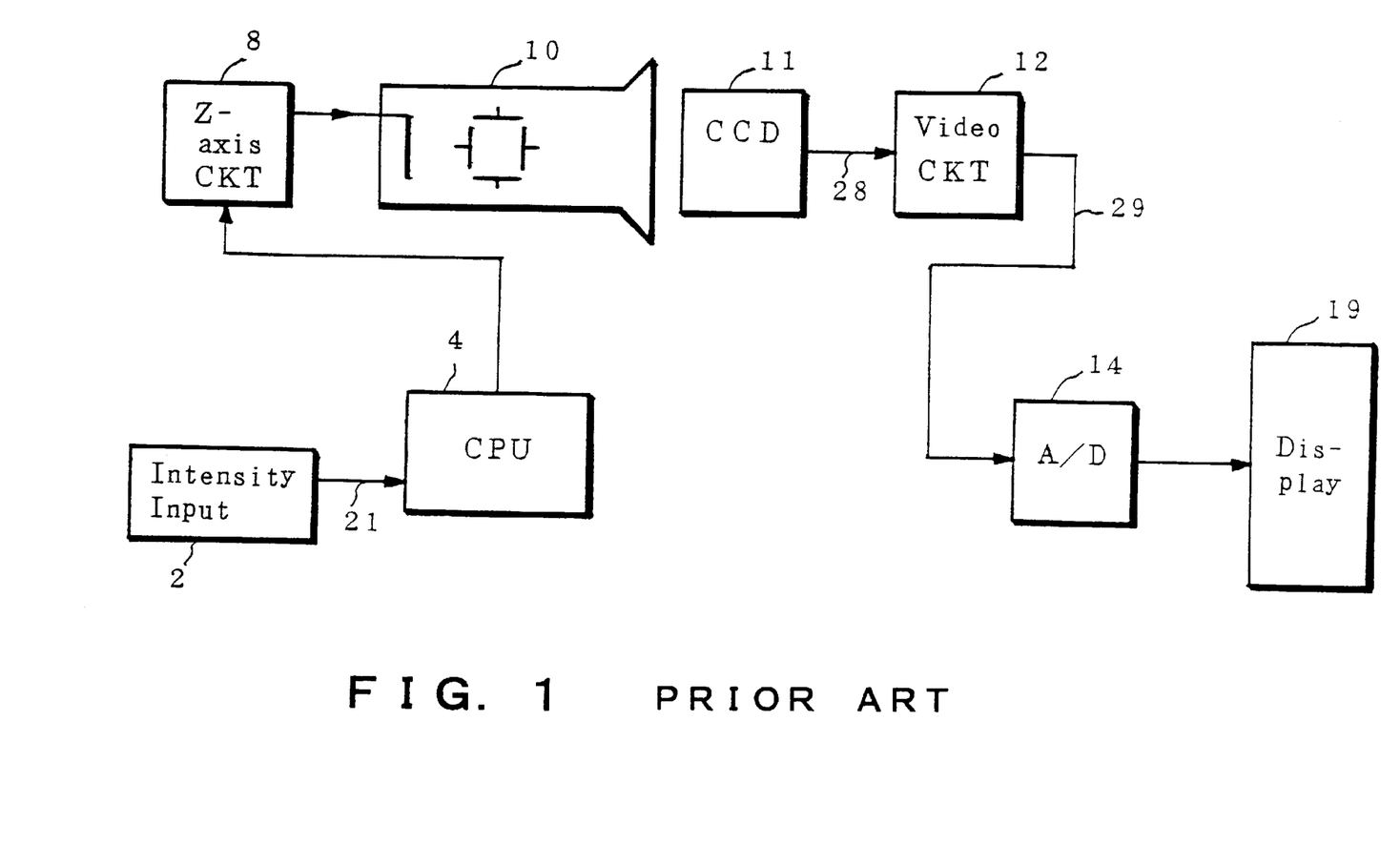
FIG. 1 is a circuit block diagram of an oscilloscope with a CCD sensor in accordance with a prior art.

Shown in FIG. 1 is a circuit block diagram of a prior art oscilloscope with a CCD sensor. A CRT 10 displays wave-forms to be observed on its surface. A Z-axis circuit 8 is connected with a cathode of the CRT 10. The Z-axis circuit 8 controls a beam current of the CRT 10 in accordance with instructions from a central processing unit (CPU) 4. An observer controls an intensity input 2 to obtain a desirable intensity of displayed wave-forms. The intensity input 2 is, for example, a variable register or a potentiometer delivering an intensity input signal 21 to the CPU 4. The CPU 4 instructs the intensity to the Z-axis circuit 8 according to the signal 21.

The CCD sensor 11 is on the surface of the CRT 10. The CCD sensor 11 reads wave-forms on the surface of the CRT 10 to deliver a CCD output 28 to a video circuit 12. The circuit 12 provides an analog to digital (A/D) converter 14 with a video signal 29. A display 19 displays the video signal converted to digital.

Figure 2:
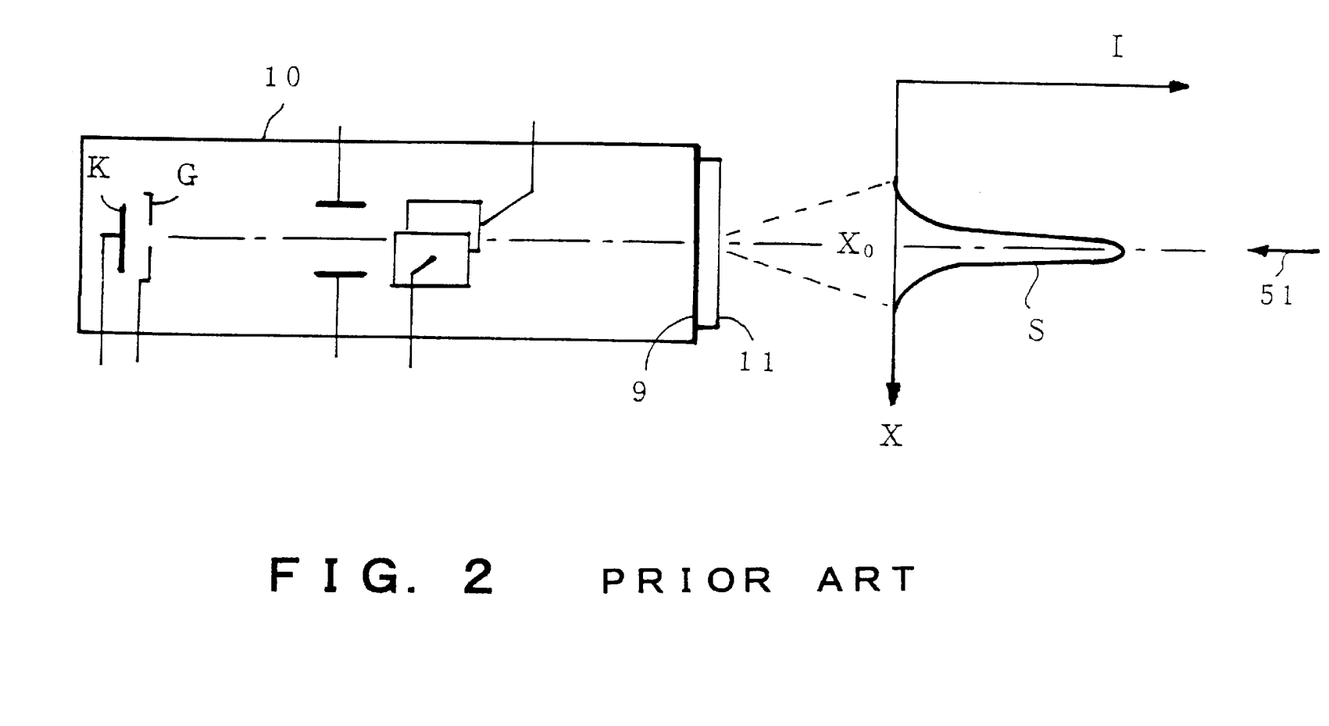
FIG. 2 is an operational illustration of a CRT and an output of the CCD sensor of FIG. 1 in accordance with the prior art.

In FIG. 2, there are shown the CRT 10, the CCD sensor 11 and an output thereof. The output of the Z-axis circuit 8 is supplied between a cathode K and a grid G of the CRT 10. The cathode K emits an electron current beam in accordance with the output of the Z-axis circuit 8. The beam is deflected by deflection plates to display bright wave-forms on a fluorescent screen 9 of the CRT 10. The CCD sensor 11 converts the bright wave-forms to an electrical signal.

A curve S shows a variation of an intensity I depending on X-position, in which the center of a bright trace is $X_0$. The maximum intensity is shown at the center position $X_0$ of a width of the bright trace in view of an arrow 51.

In FIG. 3, there are shown curves $S_a$, $S_b$, $S_c$ of (a) and curves $D_a$, $D_b$ of (b).

Figure 3A:
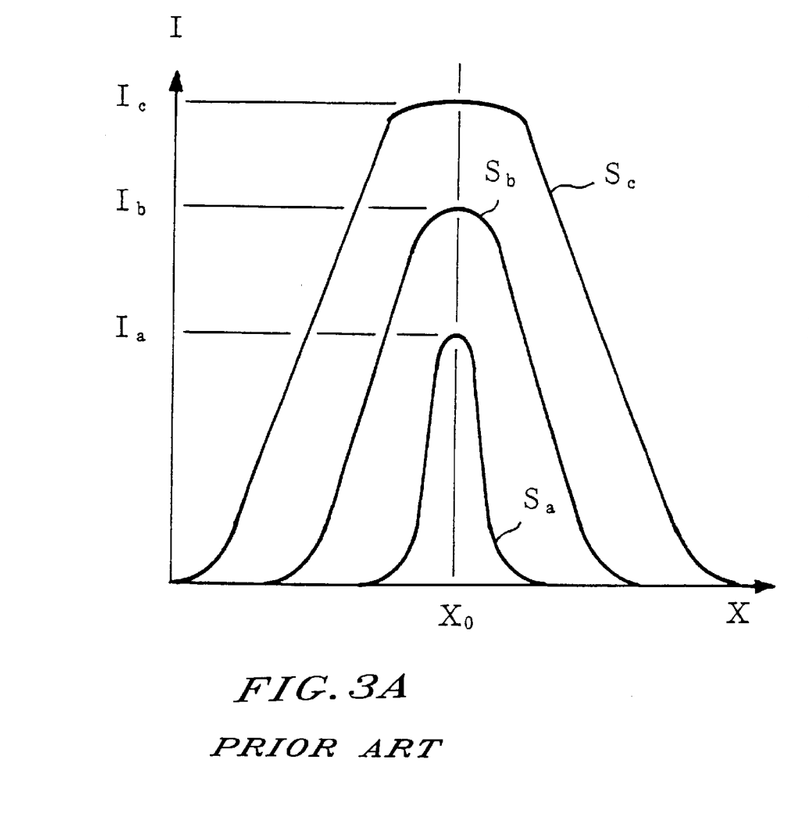
FIG. 3 is an illustration for showing intensity characteristics to intensity inputs in FIG. 1 in accordance the prior art.

In FIG. 3(a), the curve $S_a$ is the same as the curve S of FIG. 2. At the center position $X_0$, the curves $S_a$, $S_b$, and $S_c$ show respectively the intensities $I_a$, $I_b$ and $I_c$, in which $I_a<I_b<I_c$. The width of the bright trace of the curve $S_b$ is wider than that of the curve $S_a$, In the same manner, the width of $S_c$ is wider than that of $S_b$. The bright trace of $S_c$ shows a halation.

Figure 3B:
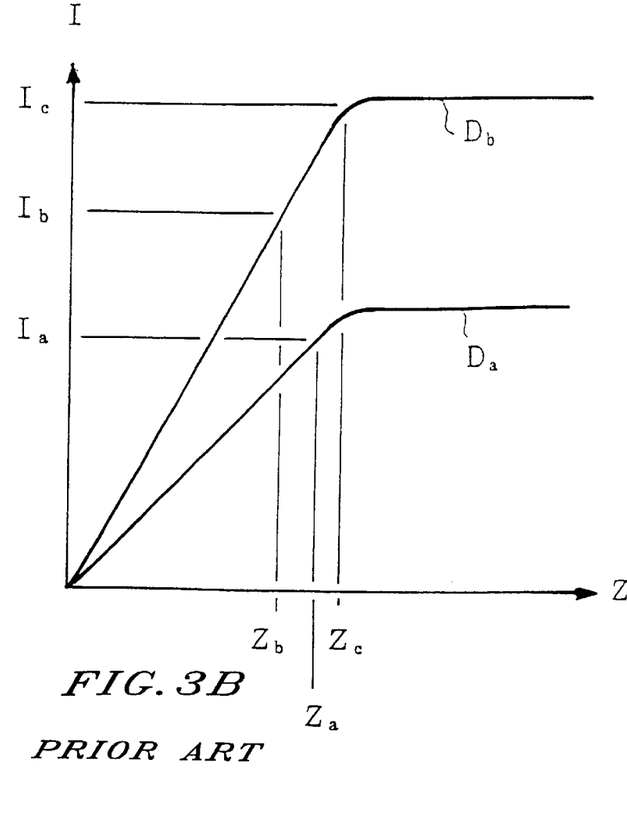

In FIG. 3(b), there are curves $D_a$ and $D_b$. Curves $D_a$ and $D_b$ show variations of intensities depending on outputs of the Z-axis circuit 8. The curve $D_a$ is in case of low repetition rate of a wave-form to be observed and $D_b$ is in case of high repetition rate.

When an output $Z_a$ of the Z-axis circuit 8 is applied to the cathode K of the CRT 10, a wave-form of a low repetition rate is displayed on the fluorescent screen 9 with an intensity $I_a$ on the curve $D_a$. When output $Z_b$ or $Z_c$ of the Z-axis circuit 8 is applied to the cathode K of the CRT 10, a wave-form of a high repetition rate is displayed on the fluorescent screen 9 with an intensity $I_b$ or $I_c$ on the curve $D_b$. In spite of the fact that the outputs $Z_a$, $Z_b$ and $Z_c$ are close in magnitude and show a relation of $Z_b<Z_a<Z_c$, intensities $I_a$, $I_b$ and $I_c$ show a relation of $I_a<I_b<I_c$. Differences among intensities $I_a$, $I_b$ and $I_c$ are quite big. It means that intensity differences depend considerably on repetition rates of wave-forms being displayed.

It is difficult to observe the low repetition rate wave-form displayed on the fluorescent screen 9, because the intensity $I_a$ is not enough for observing with the naked eye. For resolving the problem, there is a method employing a high acceleration voltage of an electron beam in the CRT 10 to strongly excite the fluorescent screen 9. In the method, there is problem that it requires a high acceleration voltage accompanying with the deterioration of the deflection sensitivity and the fluorescent screen 9 burnt up.

For avoiding those problems, the CCD sensor 11 of FIGS. 1 and 2 is employed so as to obtain bright traces of wave-forms. As shown in FIG. 3, intensities significantly depend on repetition rates of wave-forms being displayed. Trace widths of displayed wave-forms vary in wide range with halations sometimes.

SUMMARY OF THE INVENTION

An object of the present invention is to provide a novel oscilloscope intensity regulation apparatus to display wave-forms with substantially constant intensities.

Another object of the invention is to provide a novel oscilloscope with a CCD sensor on a CRT. An output of the CCD sensor is applied to a video circuit delivering a video signal.

A CPU instructs an intensity of an electron beam to a Z-axis circuit and an AGC (automatic gain control) revision signal to a AGC circuit in accordance with an intensity input signal.

The AGC circuit controls its gain for amplifying a video signal from the CCD sensor. When the video signal is small in its amplitude, the AGC circuit has a large gain. When the video signal is large, the circuit has a small gain. Therefore, an intensity of wave-forms being displayed is kept in the constant intensity desired, in spite of various repetition rates of the wave-forms or sweep velocities.

BRIEF DESCRIPTION OF THE DRAWINGS

The principle construction and operation of the present invention will be clearly understood from following detailed description taken in conjunction with the accompanying drawings, in which.

DESCRIPTION OF THE PREFERRED EMBODIMENTS

The present invention will be described herein under in detail with reference to the accompanying drawings. Like numerals and characters represent like elements throughout the figures of the drawings.

Figure 4:
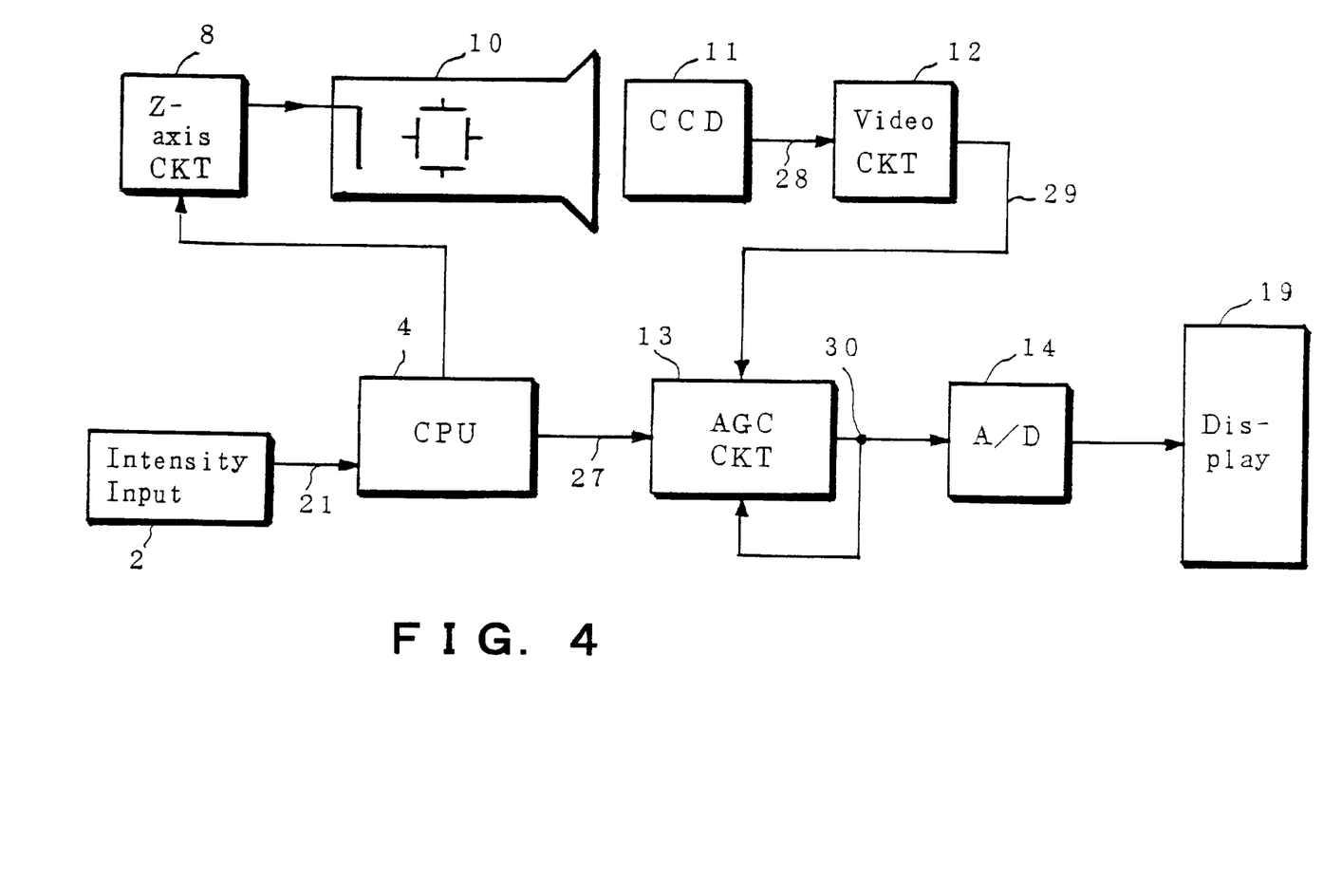
FIG. 4 is a circuit block diagram of an oscilloscope with a CCD sensor in accordance with the present invention.

FIG. 4 shows an embodiment of the present invention constructed as an oscilloscope intensity regulation apparatus.

A cathode ray tube (CRT) 10 displays wave-forms to be observed on its surface. A Z-axis circuit (CKT) 8 is connected with a cathode of the CRT 10. The Z-axis circuit 8 controls a beam current of the CRT 10 in accordance with instructions from a central processing unit (CPU) 4. An observer controls an intensity input 2 to obtain a desirable intensity of displayed wave-forms. The intensity input 2 is, for example, a variable register or a potentiometer delivering an intensity input signal 21 to the CPU 4. The CPU 4 instructs the intensity to the Z-axis circuit 8 according to the signal 21.

A CCD sensor 11 is on the surface of the CRT 10. The CCD sensor 11 reads wave-forms on the surface of the CRT 10 to deliver a CCD output 28 to a video circuit (CKT) 12.

The circuit 12 provides an automatic gain control (AGC) circuit (CKT) 13 with a video signal 29. The AGC circuit 13 amplifies the video signal 29. The AGC circuit 13 receives an AGC revision signal 27 derived from the CPU 4 in accordance with the intensity input signal 21.

When the video signal 29 is small in its amplitude, the AGC circuit 13 has a large gain. When the video signal 29 is large, the AGC circuit 13 has a small gain. The amplitude of the amplified video signal 30 is therefore regulated in accordance with the AGC revision signal 27, so as to procure the predetermined intensity.

An A/D converter 14 converts the analog amplified video signal 30 to digital for displaying wave-forms with the desired intensity on a display 19. Therefore, the wave-forms with the predetermined intensity can be displayed on the display 19.

Figure 5A:
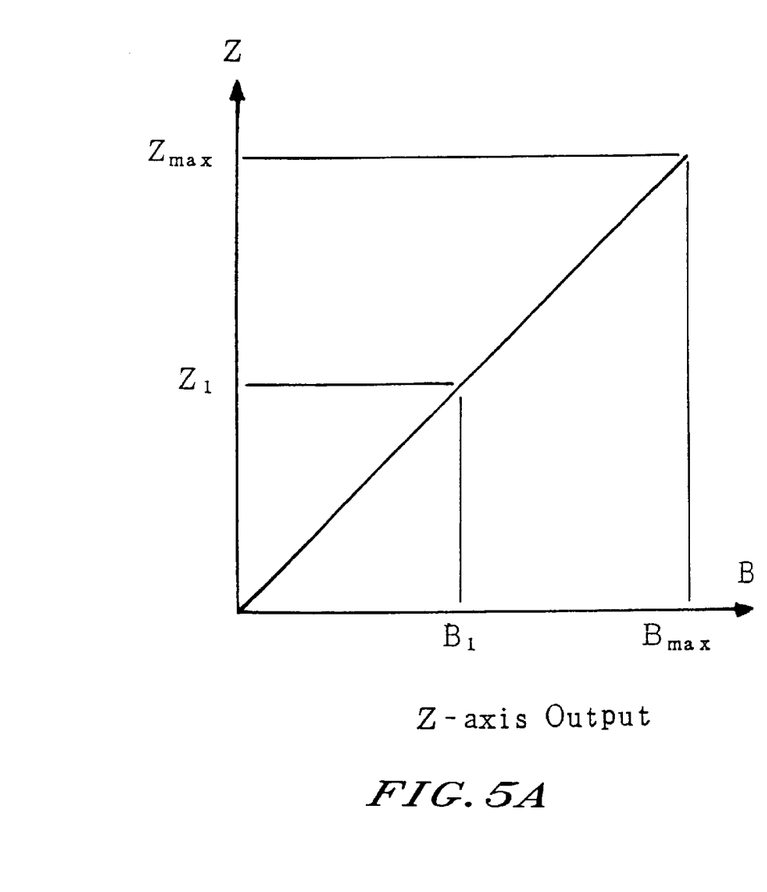
FIG. 5 is an illustration for showing automatic gain control (AGC) characteristics in FIG. 4 in accordance with the present invention.
Figure 5B:
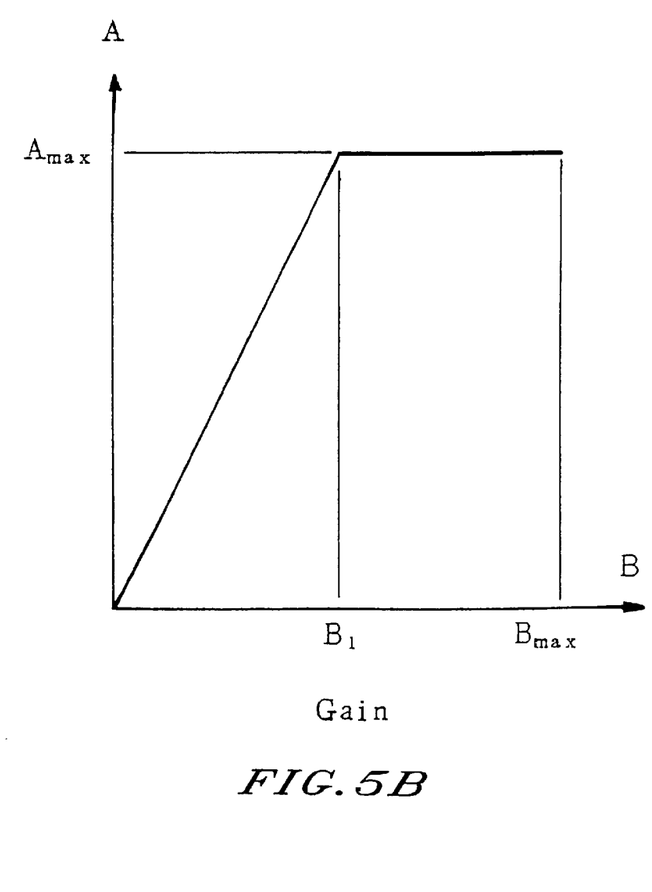

In FIG. 5(a), there is shown a character of the output of the Z-axis circuit 8 to the intensity input signal 21, and in (b), the gain of the AGC circuit 13 to the signal 21.

The larger the intensity input B of the intensity input signal 21 is, the stronger the Z-axis output Z is as shown in (a). The output Z means the electron beam current of the CRT 10. The larger the intensity input B, the lager the amplifying gain A is, in the range less than $B_1$. In the range from $B_1$ to $B_{max}$, the saturated gain $A_{max}$ is obtained. If an intensity input is $B_{max}$ and a repetition rate of a wave-form to be displayed is very low, the bigger gain than $A_{max}$ is required. It is however prevented by the saturated gain $A_{max}$ to excessively amplify a video signal 29, because the excessive big gain causes a noisy signal. By the saturated gain $A_{max}$, it is able to observe the wave-form of the low repetition rate in a suitable intensity without noise on the display 19.

Figure 6A:
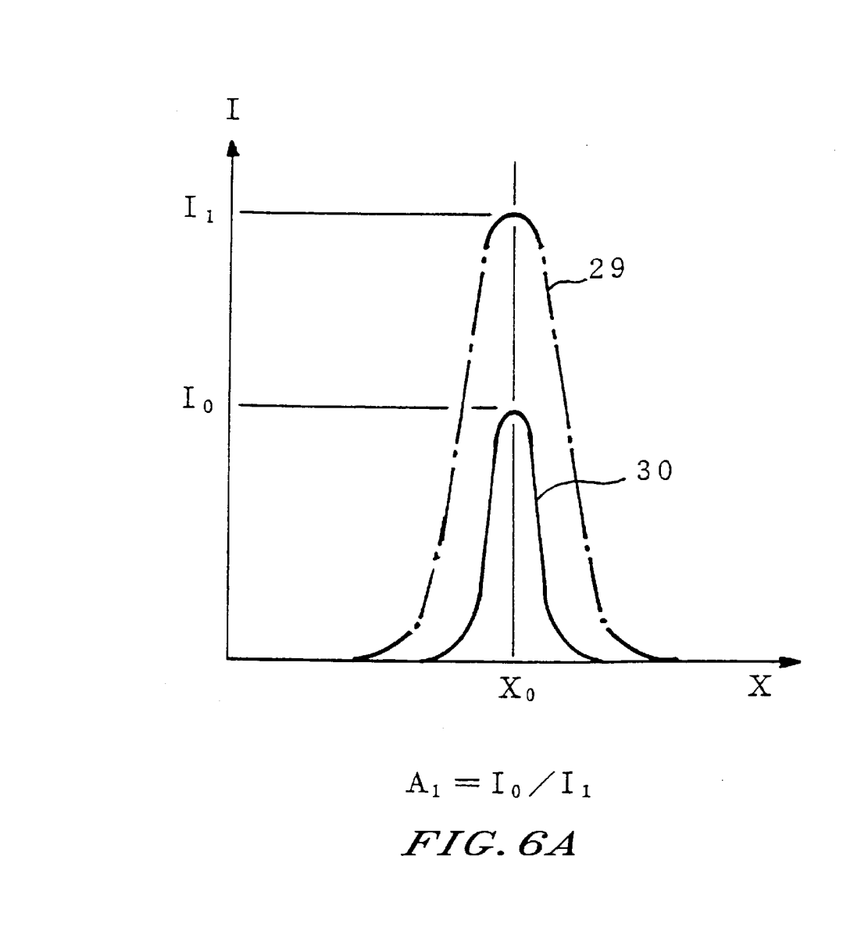
FIG. 6 is an illustration for showing characteristics of another operation of an AGC circuit in FIG. 4 in accordance with the present invention.

In FIG. 6, there is shown a character of the AGC circuit 13. The intensity $I_1$ at the trace center $X_0$ is stronger than the intensity $I_0$ in FIG. 6(a). The $I_2$ is weaker than the $I_0$ in (b). The intensity $I_1$ is stronger than the $I_2$.

Figure 6B:
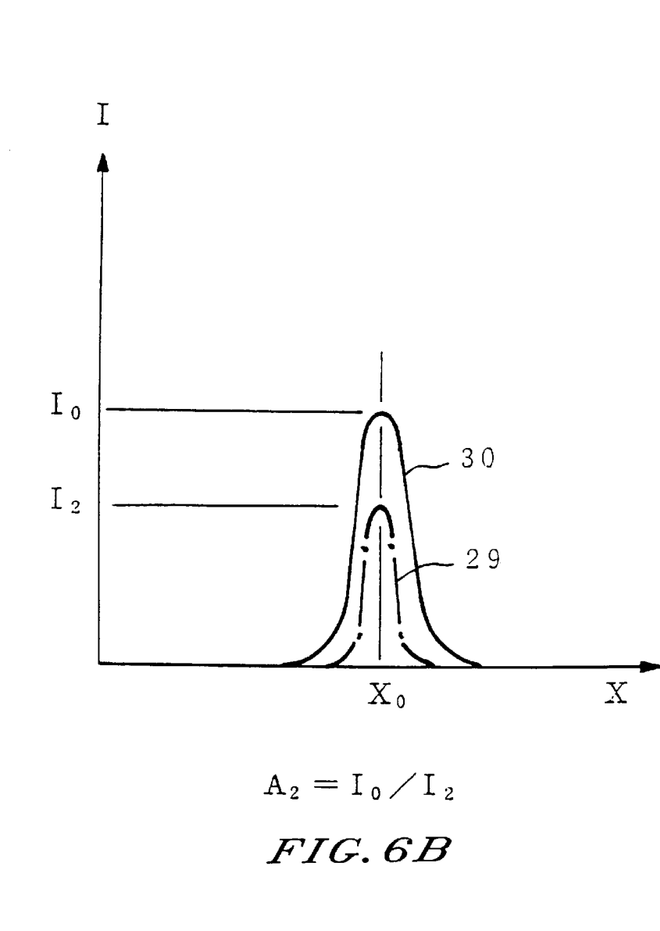

The AGC circuit 13 amplifies the video signal 29 of the intensity $I_1$ or $I_2$ so as to obtain the amplified video signal 30 of the intensity $I_0$. The AGC circuit 13 amplifies the signal 29 of the intensity $I_1$ by the small gain $A_1=I_0/I_2$ as shown in FIG. 6(a). The AGC circuit 13 amplifies the signal 29 of the intensity $I_2$ by the large gain $A_2=I_0/I_2$ as shown in FIG. 6(b). The amplified video signal 30 with the regulated intensity $I_0$ is therefore obtainable.

Figure 7:
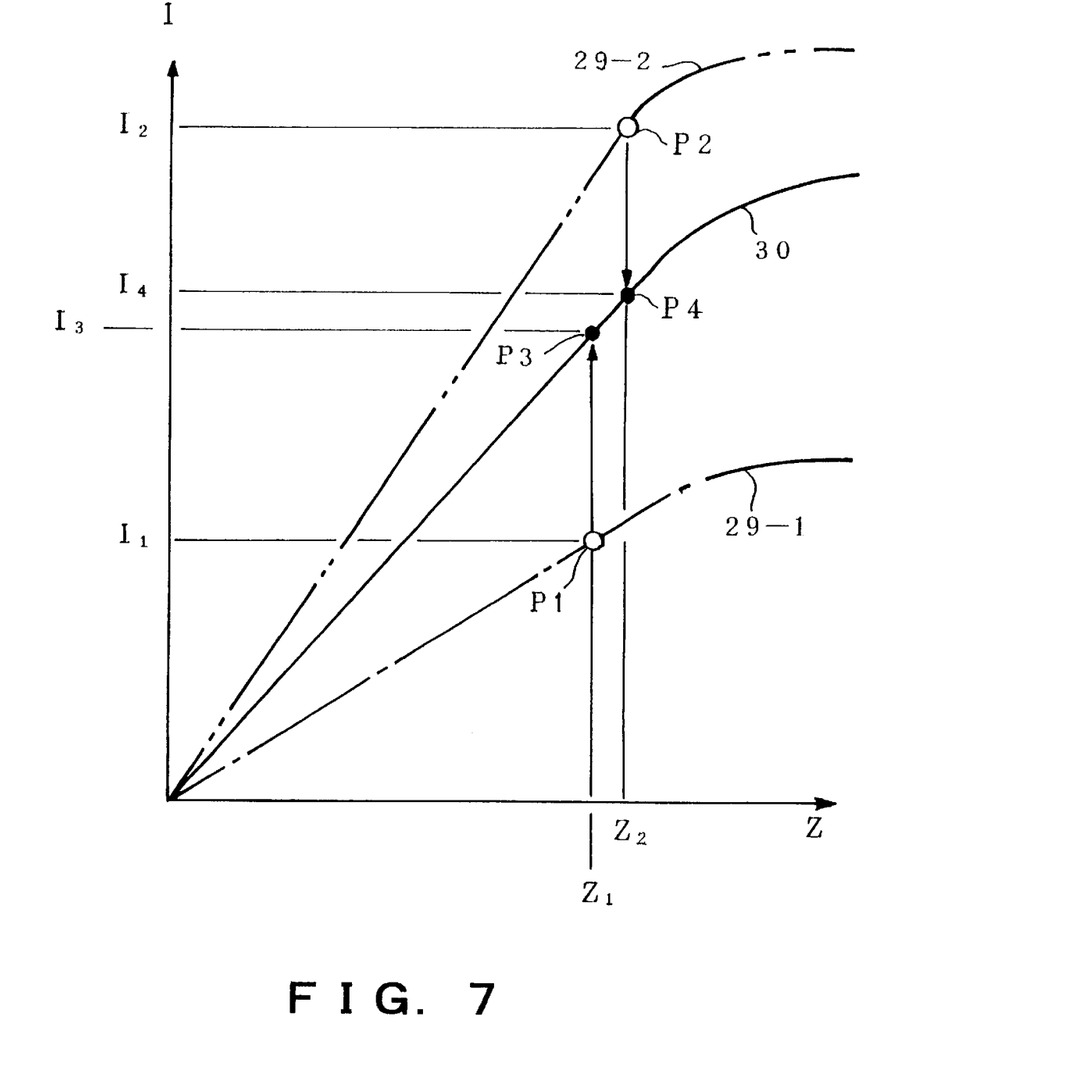
FIG. 7 is an illustration showing intensity properties to repetition rates of input wave-forms in FIG. 4 in accordance with the present invention.

In FIG. 7, there are shown characteristic curves of intensities of the amplified video signal 30 to various repetition rates of wave-forms to be displayed. The curve 29-1 shows a characteristic at a low repetition rate and 29-2 at a high repetition rate.

There are points P1 ($Z_1$, $I_1$) and P2 ($Z_2$, $I_2$) on curves 29-1 and 29-2 respectively. The $Z_1$ and $Z_2$ represent outputs of the Z-axis respectively. The $I_1$ and $I_2$ indicate intensities (i.e. amplitude of the video signal 29) of wave-forms to be displayed respectively. A curve 30 shows a amplified video signal 30.

The AGC circuit 13 amplifies the video signal 29-1 at P1 or 29-2 at P2 so as to obtain the amplified video signal 30 at P3 ($I_3$) or P4 ($I_4$) on the curve 30. The intensity difference between I3 ($Z_1$) and $I_4$ ($Z_2$) is nearly zero in spite of a large difference between $I_1$ ($Z_1$) and $I_2$ ($Z_2$) in which Z-axis output $Z_1$ or $Z_2$ is not changed.

Figure 8:
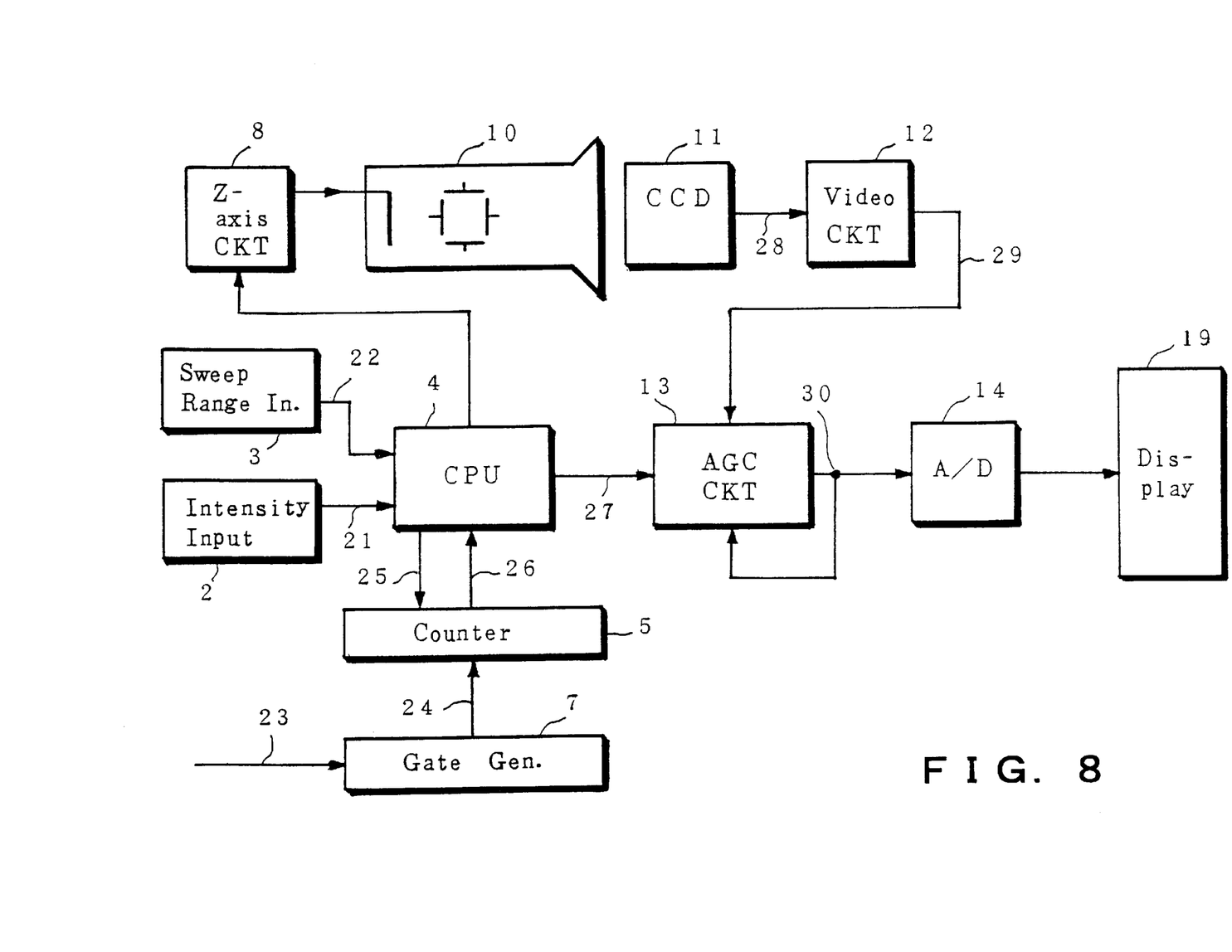
FIG. 8 is a circuit block diagram of another embodiment in accordance with the present invention.

In FIG. 8, there is shown a circuit block diagram of the second embodiment of the invention. Here, the reference numerals in FIG. 8 are same as those of FIG. 4.

The CRT 10 displays wave-forms to be observed on its surface. A Z-axis circuit 8 is connected with a cathode of the CRT 10. The Z-axis circuit 8 controls a beam current of the CRT 10 in accordance with instructions from a central processing unit (CPU) 4.

An observer controls an intensity input 2 to obtain a desirable intensity of displayed wave-forms and selects a sweep range input 3 to deliver a sweep range input signal 22 to the CPU 4. The intensity input 2 is, for example. a variable register or a potentiometer delivering an intensity input signal 21 to the CPU 4. The CPU 4 instructs the intensity to the Z-axis circuit 8 according to the intensity input signal 21 and the sweep range input signal 22.

When applied a trigger 23 synchronizing with the wave-form to be displayed, a gate generator 7 generates a gate 23 to supply it a counter 5. The gate 24 is for a sweep generator not shown in FIG. 8. Therefore, the repetition rate of the gate 24 is the same as that of the wave-form to be displayed in almost all cases.

The counter 5 receives a reset signal 25 at the predetermined interval from the CPU 4 and starts to count the gate 24. When applied the next reset signal 25, the counter 5 delivers a counted number 26 of the gate 24 during each cycle of the reset signal 25 to the CPU 4.

The CPU 4 instructs the Z-axis circuit 8 to deliver its output to the CRT 10 in accordance with an intensity input signal 21, a sweep range input signal 22 and the counted numbers 26.

The CCD sensor 11 is on the surface of the CRT 10. The CCD sensor 11 reads wave-forms on the surface of the CRT 10 so as to deliver a CCD output 28 to a video circuit 12. The circuit 12 provides an AGC circuit 13 with a video signal 29.

The AGC circuit 13 amplifies the video signal 29. The AGC circuit 13 receives an AGC revision signal 27 derived from the CPU 4 in accordance with the intensity input signal 21, the sweep range input signal 22 and the counted number 26.

The AGC circuit 13 amplifies the video signal of a large amplitude by a small gain, and a small amplitude by a large gain. The AGC circuit 13 can therefore deliver an amplified video signal 30 of the regulated amplitude to the A/D converter 14. The A/D converter 14 converts the analog signal 30 to digital so as to supply it to the display 19 displaying wave-forms with the regulated intensity.

Figure 9A:
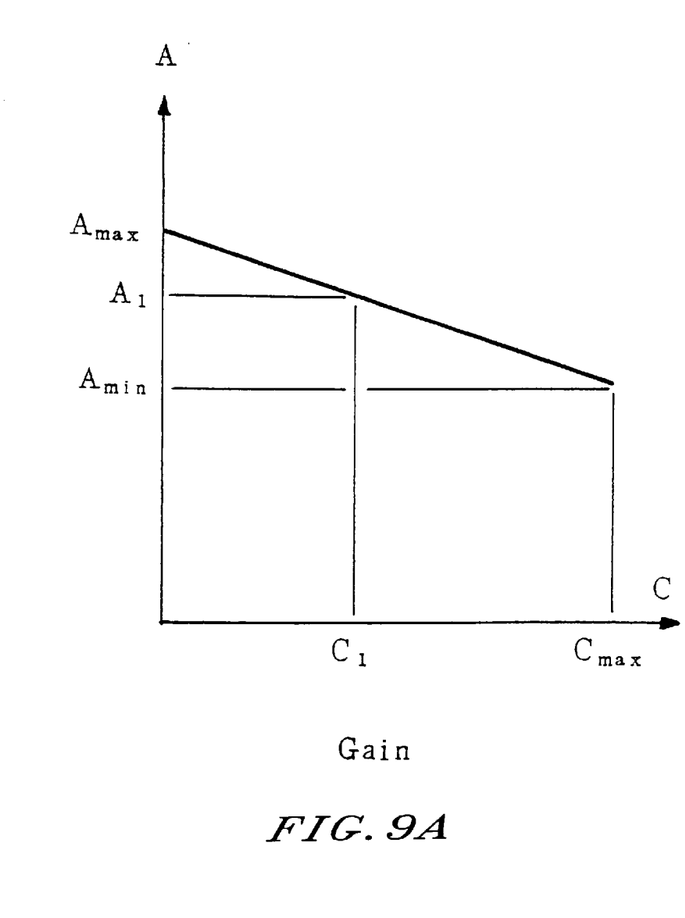
FIG. 9 is an illustration for showing AGC characteristics in FIG. 8 in accordance with the present invention.

In FIGS. 9(a) and (b), there are shown the gain A and Z axis output to the counted number C respectively.

A gain $A_1$ is set by a counted number $C_1$ in (a) so as to obtain a Z-axis output $Z_1$ in (b). When the counted number C is nearly equal to zero, a gain $A_{max}$ is set in (a) and a Z-axis output $Z_{max}$ is obtained in (b). When $C_{max}$, a gain $A_{min}$ is set in (a) and an output $Z_{min}$ is obtained in (b), In FIG. 10, there is shown a flowchart of the initial operation flow of the CPU 4 of FIG. 8.

Figure 10:
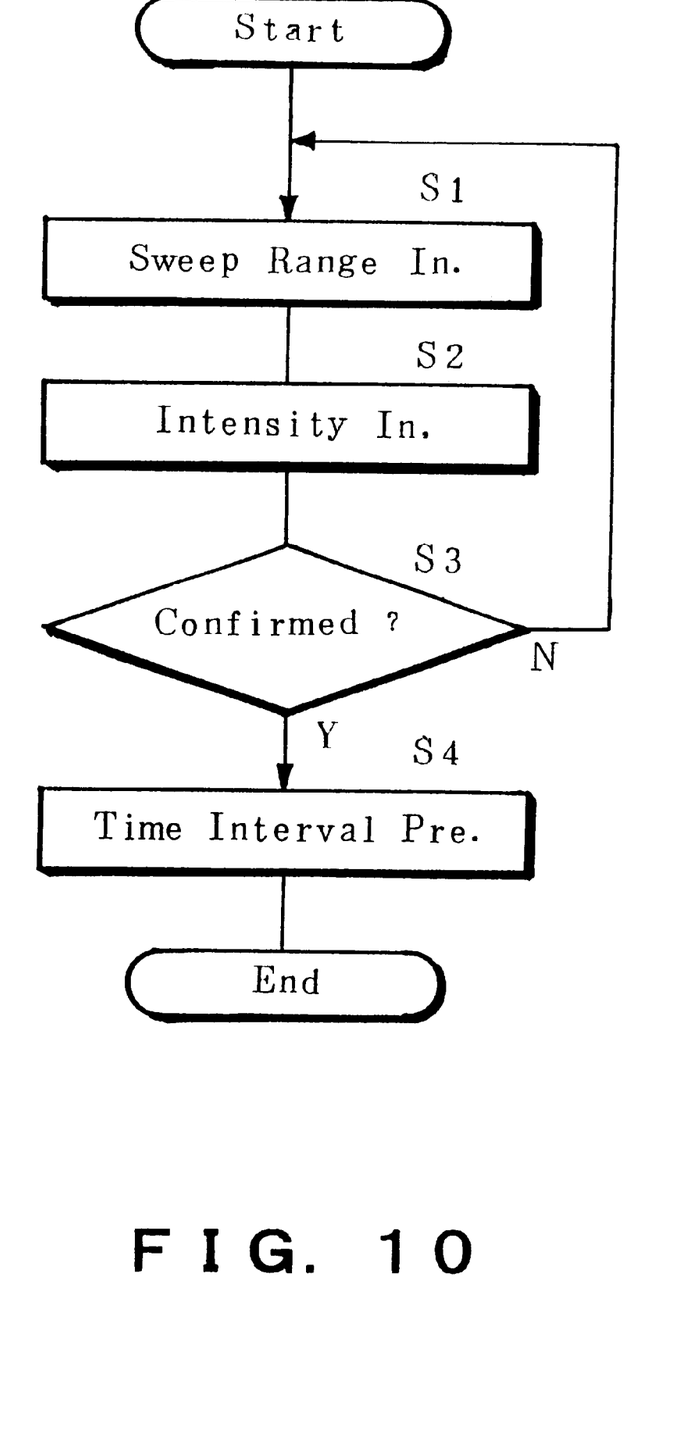
FIG. 10 is a flowchart of an initial operation flow of a CPU in FIG. 8 in accordance with the present invention.

The CPU 4 starts to operate. The CPU 4 receives the sweep range input signal 22 instructed by the sweep range input 3 in a step S1 and the intensity input signal 21 instructed by the intensity input 2 in a step S2.

The CPU 4 confirms those instructed signals 22 and 21 in a step S3. When confirmed in a step S3Y, the CPU 4 presets the time interval of the reset signal 25 in a step S4. The initial operation ends.

Figure 11:
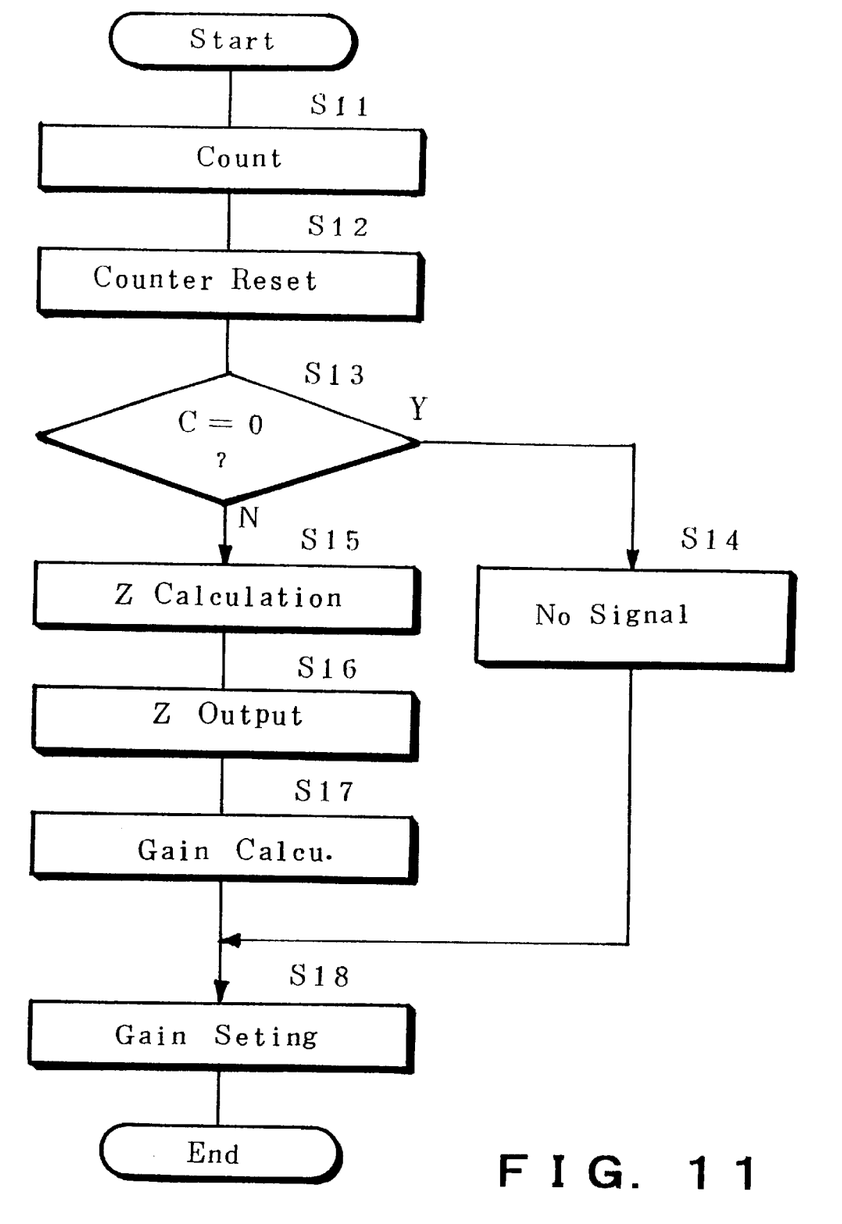
FIG. 11 is a flowchart of an operation flow of FIG. 8 in accordance with the present invention.

In FIG. 11, there is shown a flowchart of the operation flow of the CPU 4 for observing wave-forms in FIG. 8.

After the initial operation of FIG. 10, the counter 5 starts to count the gate 24 and the CPU 4 reads the counted number 26 in a step S11.

Figure 9B:
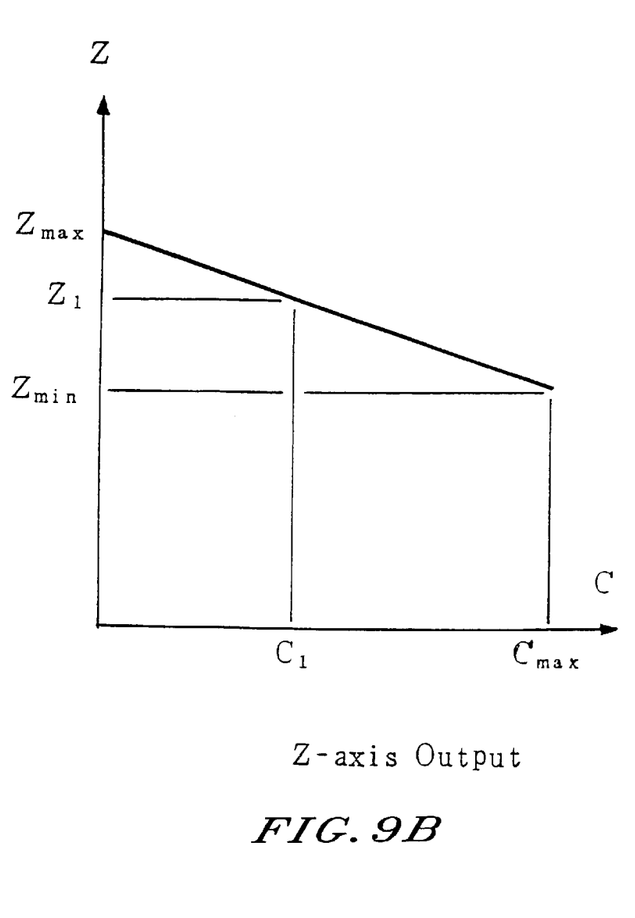

Thereat the CPU 4 delivers the reset signal 25 to the counter 5 which is reset in a step S12. When the counted number 26 is zero in a step S13Y, no input signal is observed in a step S14. When the counted number 26 is not zero in a step S13N, the CPU 4 calculates the Z-axis output Z as shown in FIG. 9(b) in a step S15 and delivers it to the a CRT 10 in a step S16.

The CPU 4 calculates the gain A as shown in FIG. 9(a) in a step S17. The gain A is set in a step S18. When the counted number C is not zero and it is however nearly equal to zero in the step S13N, the CPU 4 sets a gain $A_{max}$ as shown in FIG. 9(a). When the counted number C is zero in the step S13Y that is no input signal, the a CPU 4 can set a gain $A_{min}$ or less without setting the gain $A_{max}$ so as to prevent the generation of the noisy amplified video signal.

Figure 12:
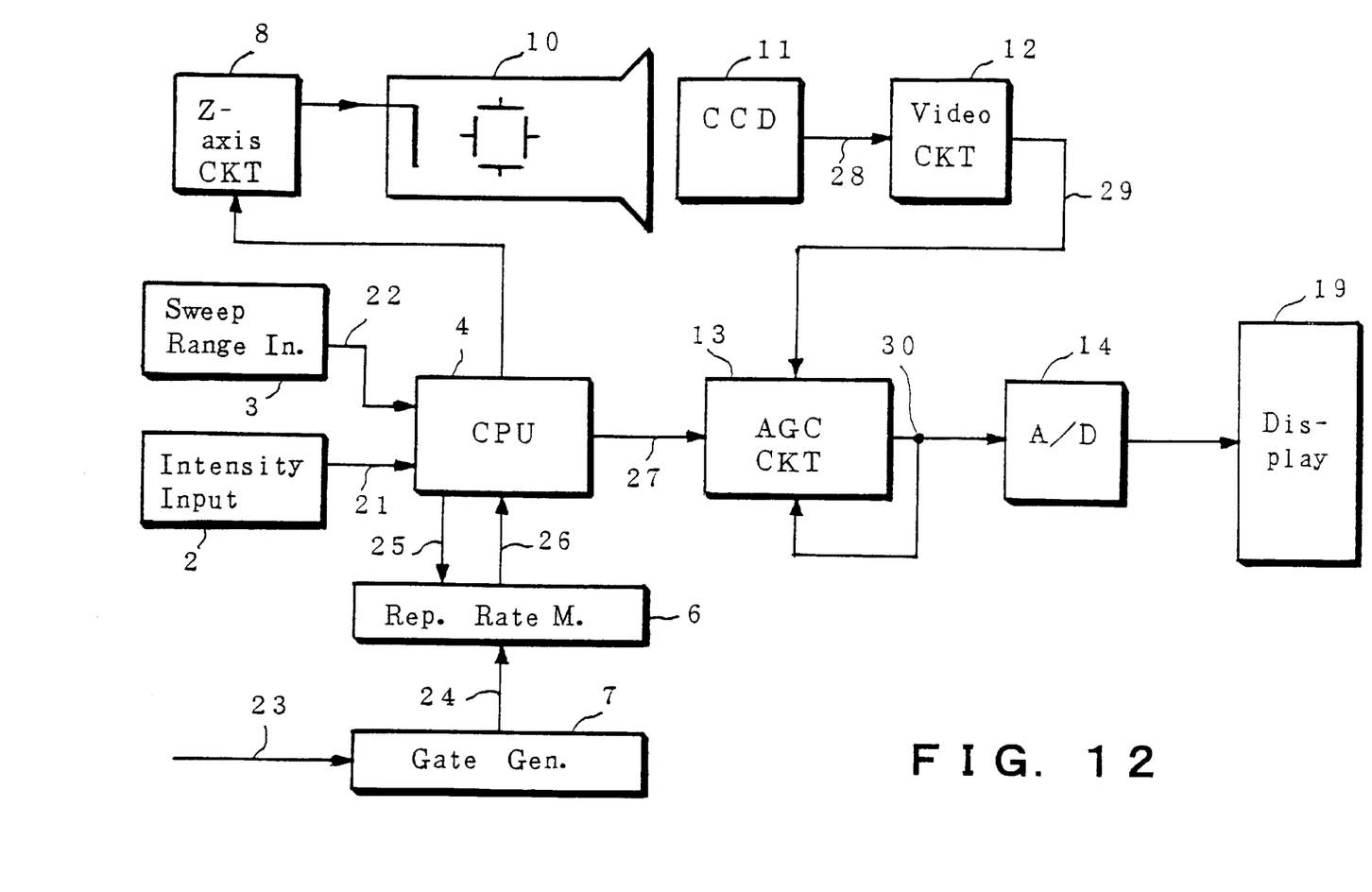
FIG. 12 is a circuit block diagram of the third embodiment in accordance with the present invention.

In FIG. 12, there is shown a circuit block diagram of the third embodiment of the invention. Here, the reference numerals in FIG. 12 are same as those of FIG. 8.

The CRT 10 displays wave-forms to observed on its surface. A Z-axis circuit 8 is connected with a cathode of the CRT 10. The Z-axis circuit 8 controls a beam current of the CRT 10 in accordance with instructions from a central processing unit (CPU) 4.

An observer controls an intensity input 2 to obtain a desirable intensity of displayed wave-forms and selects a sweep range input 3 so as to deliver a sweep range input signal 22 to the CPU 4. The intensity input 2 is, for example. a variable register or a potentiometer delivering an intensity input signal 21 to the CPU 4. The CPU 4 instructs the intensity to the Z-axis circuit 8 according to the intensity input signal 21 and the sweep range input signal 22.

When applied a trigger 23 synchronizing with the wave-form to be displayed, a gate generator 7 generates a gate 24 to supply it a repetition rate mater 6. The gate 24 is for a sweep generator not shown in FIG. 12. Therefore, the repetition rate of the gate 24 is the same as that of the wave-form to be displayed in almost all cases.

A repetition rate meter 6 receives a reset signal 25 at the predetermined interval from the CPU 4 and starts to level up an internal voltage according to the number of the gate 24. The internal voltage is converted to digital so as to obtain the digital value. When applied the next reset signal 25, the meter 6 delivers the digital value as the counted number 26 of the gate 24 during each cycle of the reset signal 25 to the CPU 4.

The CPU 4 instructs the Z-axis circuit 8 so as to deliver its output to the CRT 10 in accordance with an intensity input signal 21, a sweep range input signal 22 and the counted number 26.

The CCD sensor 11 is on the surface of the CRT 10. The CCD sensor 11 reads wave-forms on the surface of the CRT 10 to deliver a CCD output 28 to a video circuit 12. The circuit 12 provides an AGC circuit 13 with a video signal 29.

The AGC circuit 13 amplifies the video signal 29. The AGC circuit 13 receives an AGC revision signal 27 derived from the CPU 4 in accordance with the intensity input signal 21, the sweep range input signal 22 and the counted number 26.

The AGC circuit 13 amplifies the video signal of a large amplitude by a small gain, and a small amplitude by a large gain. The AGC circuit 13 can therefore deliver an amplified video signal 30 of a regulated amplitude to the A/D converter 14. The A/D converter 14 converts the analog signal 30 to digital so as to supply it to the display 19 displaying wave-forms with a regulated intensity.

Figure 13:
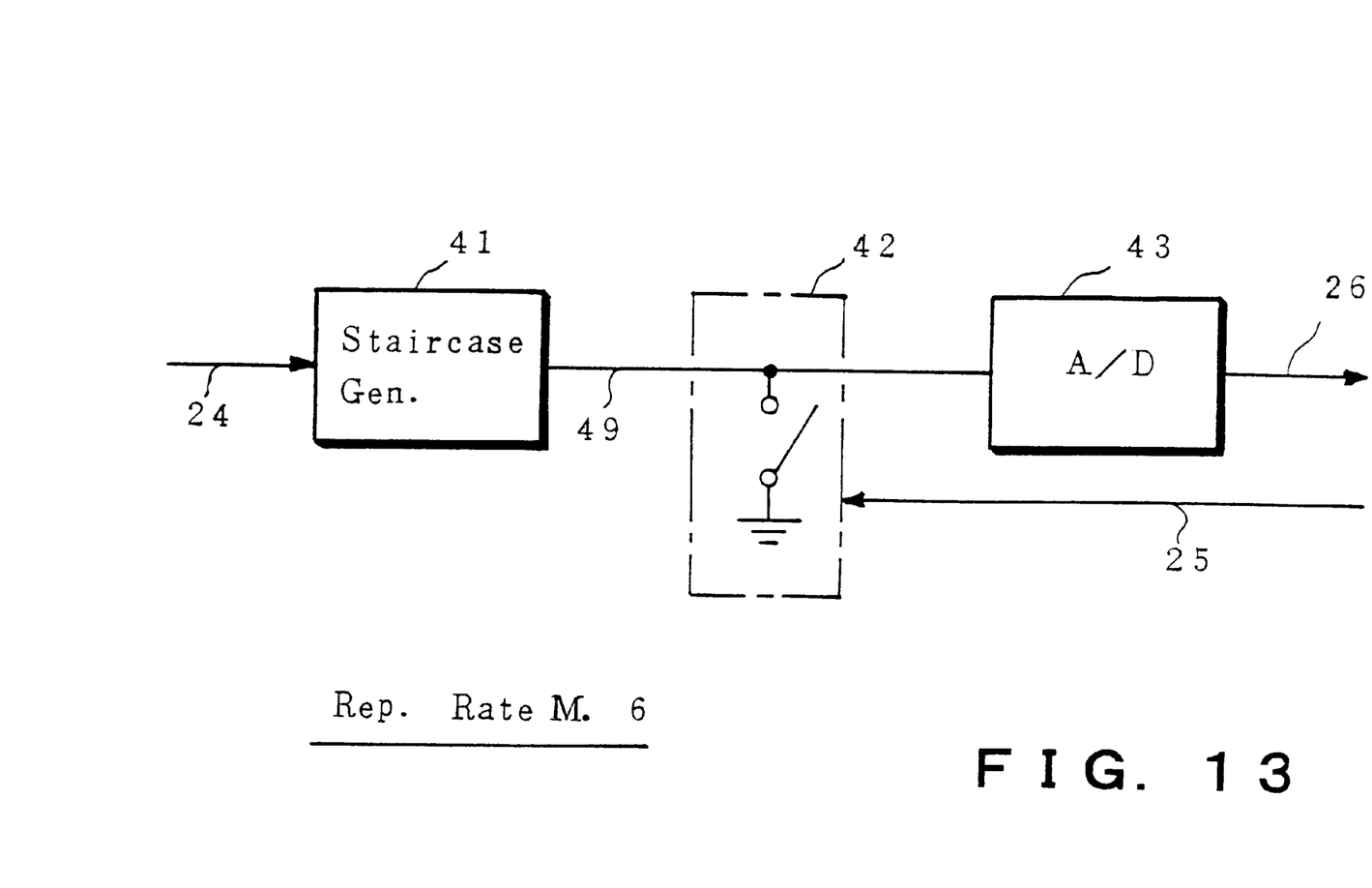
FIG. 13 is a circuit diagram of a repetition rate meter which is one of elements of FIG. 12 in accordance with the present invention.

In FIG. 13 there is shown a circuit diagram of the repetition rate meter 6. A staircase generator 41 generates a staircase signal 49 by stepping up a stair every gate 24 applied. A reset switch 42 resets the staircase signal 49 to zero at the timing of the reset signal 25.

An A/D converter 43 converts the staircase signal 49 just prior to the reset signal 25 to digital value as the counted number 26 to be delivered to the CPU 4.

Figure 14:
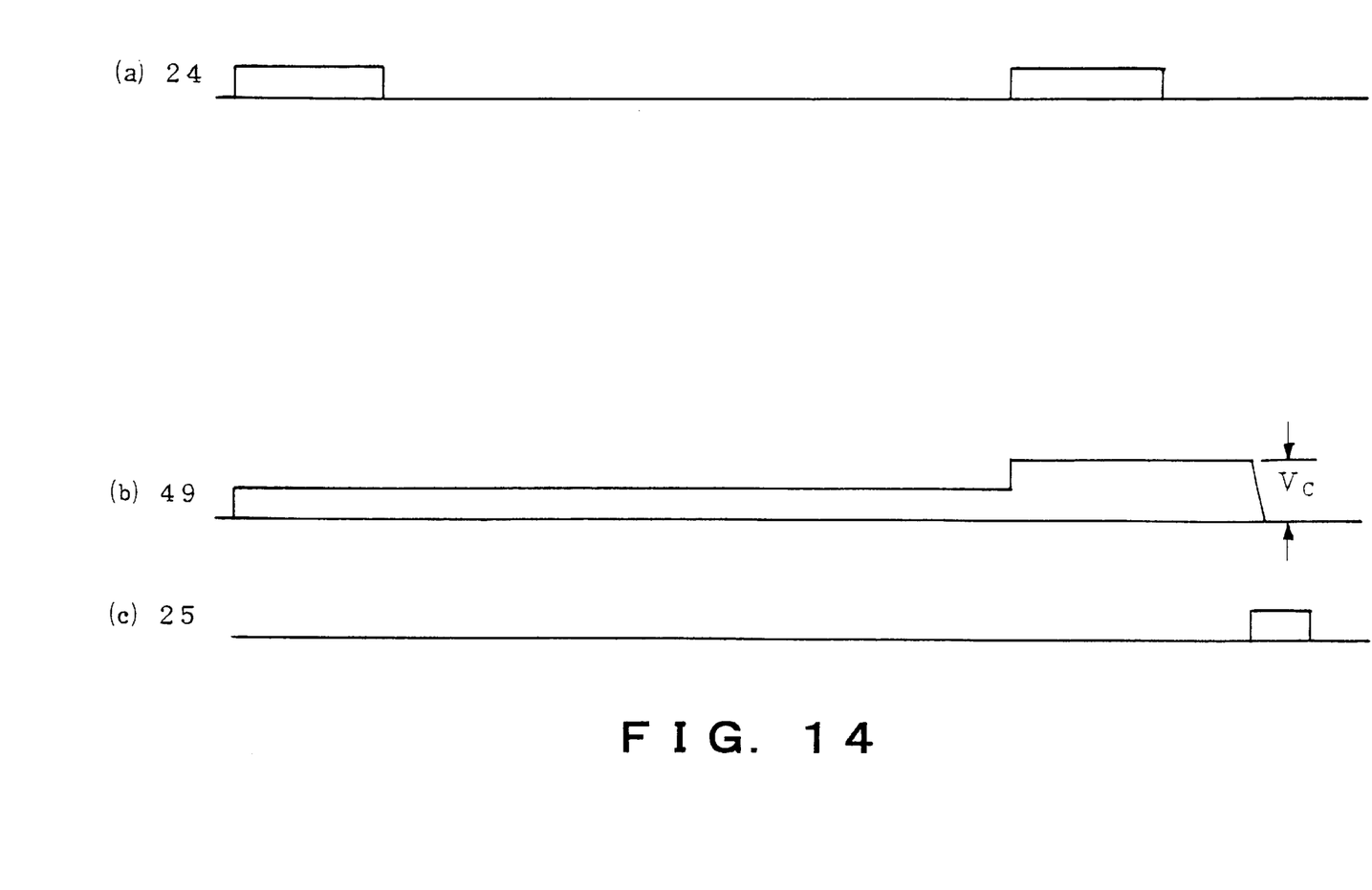
FIG. 14 is a time chart of the repetition rate meter of FIG. 13 in which a repetition rate of a gate is low.
Figure 15:
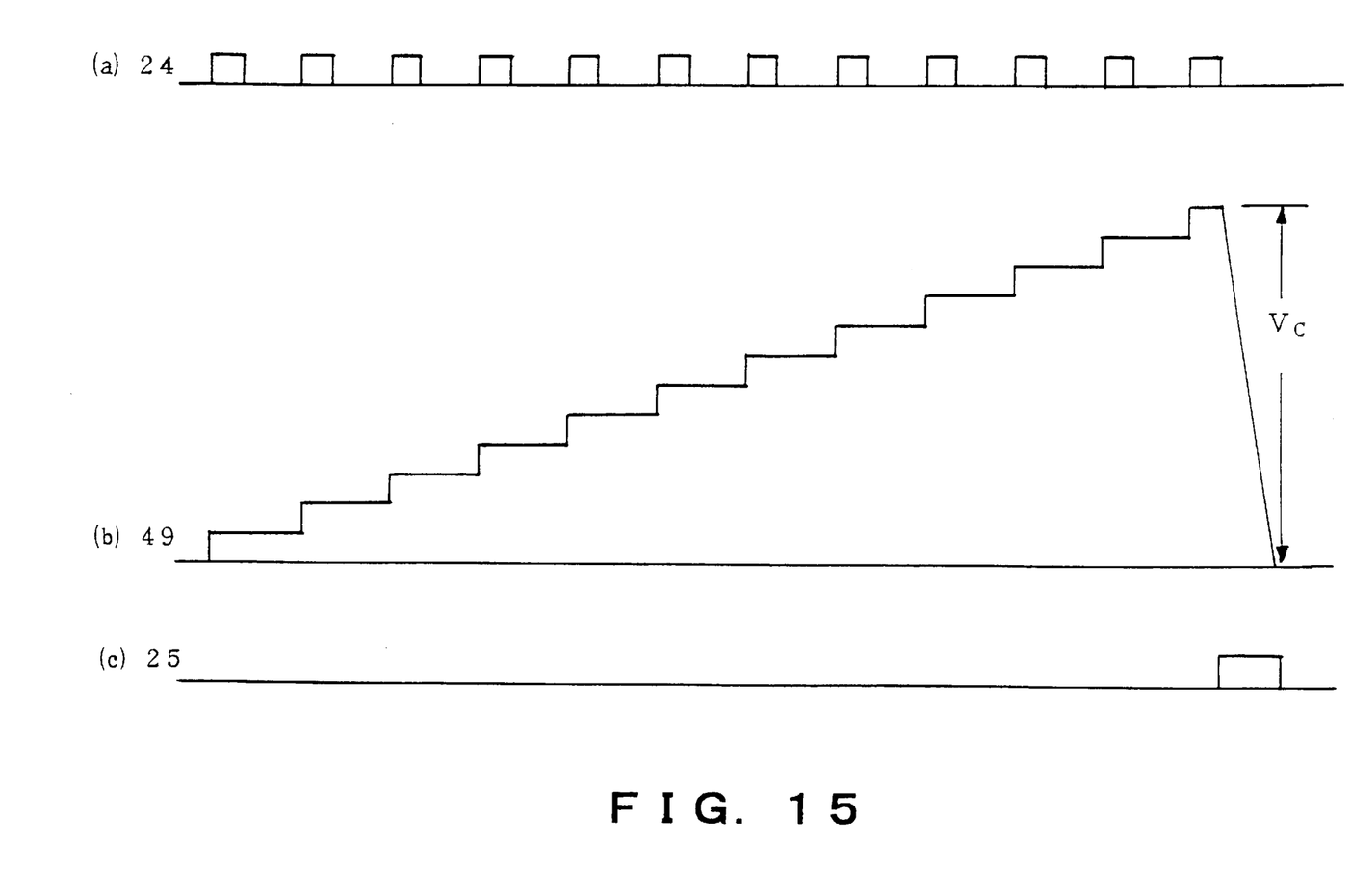
FIG. 15 is a time chart of the repetition rate meter of FIG. 13 in which a repetition rate of the gate is high.

In FIGS. 14 and 15, there are shown time charts of the repetition rate meter 6 in the cases of the low and high repetition rates of the gate 24 respectively.

The staircase signal is of (b) is stepped up every gate 24 of (a) applied. The signal 49 of (b) is reset by the reset signal 25 of (c). The amplitude $V_C$ is converted to digital value as the counted number 26 which is delivered to the CPU 4.

Here, the counted number 26 does not accurately represent the repetition rate of the gate 24. The number 26 being proportional or logarithmic to the repetition rate of the gate 24 is usable.

It is possible by using the oscilloscope of the invention to observe wave-forms with the regulated intensity in spite of variations of repetition rates of wave-forms or sweep ranges.

Having described specific embodiments of the bearing, it is believed obvious that modification and variation of the invention is possible in light of the above teachings.

What is claimed is:

1. An oscilloscope intensity regulation apparatus, comprising:

cathode ray tube (CRT) means for displaying a wave-form to be observed on a fluorescent screen thereof by means of an electron beam;

Z-axis means for delivering a Z-axis output to the CRT so as to obtain the electron beam;

a central processing unit (CPU) means for delivering instructions of a value of the Z-axis output to the Z-axis means and of an AGC revision signal indicating a predetermined intensity ($B_1$) by receiving an intensity input signal;

sensing means for sensing the wave-form on the fluorescent screen so as to obtain a sensing output;

video means for producing a video signal from the sensing output;

automatic gain control (AGC) means for obtaining an amplified video signal of an amplitude regulated by the AGC revision signal so as to procure the predetermined intensity ($B_1$); and displaying means for displaying the wave-form with the predetermined intensity ($B_1$) in accordance with the amplified video signal.

2. The apparatus according to claim 1, wherein said CPU means gives the instructions of the AGC revision signal for a predetermined maximum gain $A_{max}$ to the AGC means when the intensity input signal is over the predetermined intensity ($B_1$).

3. An oscilloscope intensity regulation apparatus, comprising:

cathode ray tube (CRT) means for displaying a waveform to be observed on its fluorescent screen by means of an electron beam;

Z-axis means for delivering a Z-axis output to the CRT so as to obtain the electron beam;

a central processing unit (CPU) means for delivering instructions of a value of the Z-axis output to the Z-axis means and of an AGC revision signal, and for delivering a reset signal so as to obtain a counted number according to a repetition rate of the wave-form to be observed by receiving an intensity input signal, a sweep range input signal and the counted number;

sensing means for sensing the wave-form on the fluorescent screen so as to obtain a sensing output;

video means for producing a video signal from the sensing output;

automatic gain control (AGC) means for obtaining an amplified video signal of an amplitude regulated by the AGC revision signal; and displaying means for displaying the wave-form with an intensity in accordance with the amplified video signal.

4. The apparatus according to claim 3, wherein a counter for counting a number of gates as the counted number representing a repetition rate of the wave-form to be observed between the reset signals is included.

5. The apparatus according to claim 3, wherein a repetition rate meter for delivering a repetition rate value according to an amplitude of a staircase stepped up every gate by receiving the reset signal as the counted number is included.

6. The apparatus according to claim 3, wherein said CPU means delivers the instructions of the AGC revision signal instructing a minimum gain $A_{min}$ by receiving zero of the counted number.

7. The apparatus according to claim 5, wherein said repetition rate meter includes a staircase generating means for generating the staircase stepped up every gate, a reset means for resetting the staircase by receiving the reset signal and an A/D converting means for converting an amplitude ($V_C$) of the staircase to digital so as to deliver a repetition rate value as the counted number.

* * * * *